(12) United States Patent
Keller (10) Patent No.: US 7,170,755 B2
(45) Date of Patent: Jan. 30, 2007

(54) ELECTRONICS CARD WITH AN ALIGNMENT OPENING

(75) Inventor: G. James Keller, Petaluma, CA (US)

(73) Assignee: Tellabs Petaluma, Inc., Petaluma, CA (US)

( * ) Notice: Subject to any disclaimer, the term of this patent is extended or adjusted under 35 U.S.C. 154(b) by 346 days.

(21) Appl. No.: 10/732,617

(22) Filed: Dec. 9, 2003

(65) Prior Publication Data

US 2006/0034062 A1 Feb. 16, 2006

(51) Int. Cl.
H05K 5/00 (2006.01)

(52) U.S. Cl. .......................... 361/756; 361/727; 361/686

(58) Field of Classification Search ................ 361/796, 361/729, 730, 752, 756, 760, 720, 736, 748, 361/784–785

See application file for complete search history.

(56) References Cited

U.S. PATENT DOCUMENTS

| 3,231,785 | A | * | 1/1966 | Calabro | 361/689 |
| 3,723,823 | A | * | 3/1973 | Lit et al. | 361/802 |
| 3,731,157 | A | * | 5/1973 | Reimer | 361/802 |
| 4,007,403 | A | * | 2/1977 | Fiege | 361/748 |
| 4,019,099 | A | * | 4/1977 | Calabro | 361/756 |
| 4,022,326 | A | * | 5/1977 | Marconi | 211/41.17 |
| 4,096,547 | A | * | 6/1978 | Calabro | 361/708 |
| 4,164,362 | A | * | 8/1979 | Cobaugh et al. | 439/64 |
| 5,467,254 | A | * | 11/1995 | Brusati et al. | 361/799 |
| 6,366,473 | B1 | * | 4/2002 | Sauer | 361/818 |
| 6,370,036 | B1 | * | 4/2002 | Boe | 361/801 |
| 6,496,384 | B1 | * | 12/2002 | Morales et al. | 361/784 |
| 6,560,116 | B2 | * | 5/2003 | Sauer | 361/741 |

* cited by examiner

Primary Examiner—Tuan Dinh
Assistant Examiner—Hung S. Bui
(74) Attorney, Agent, or Firm—Mark C. Pickering (57) ABSTRACT

An electronics card, such as a backplane, is precisely aligned with a structure, such as a card cage, via alignment tabs by forming the electronics card to have alignment openings that extend through the electronics card and snuggly accept the tabs. The alignment opening has a width, while the tabs have a thickness that is greater than zero and less than the width. Further, the alignment openings have lengths that are the same size as the lengths of the alignment tabs.

25 Claims, 4 Drawing Sheets

ELECTRONICS CARD WITH AN ALIGNMENT OPENING

BACKGROUND OF THE INVENTION

1. Field of the Invention

The present invention relates to electronics cards and, more particularly, to an electronics card with an alignment opening.

2. Description of the Related Art

Figure 1:
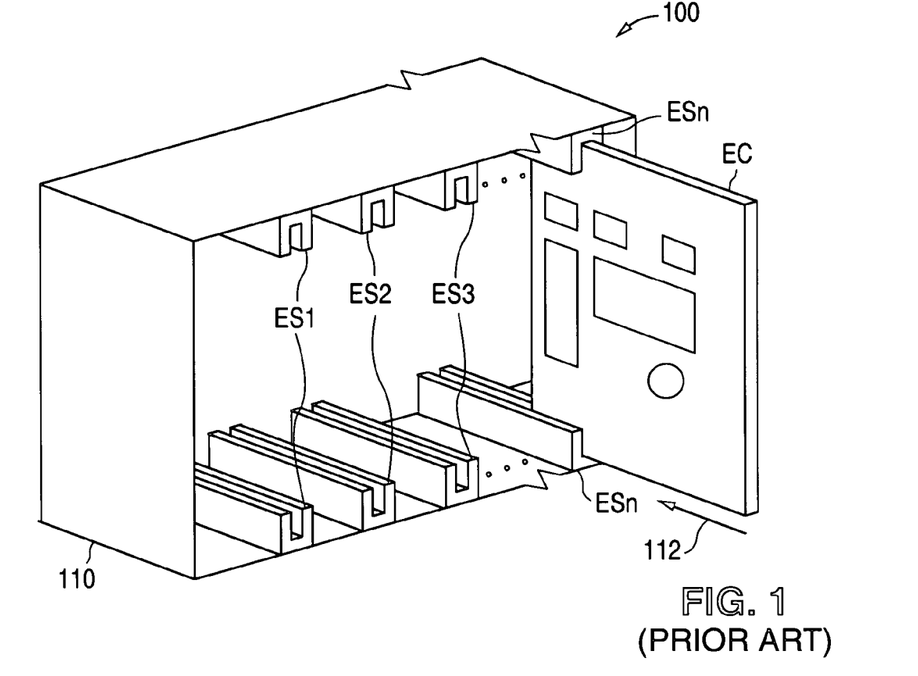
FIG. 1 is a front-side perspective view illustrating a prior-art card cage 100.

A card cage is a structure, typically metal, that includes pairs of edge supports that support a number of electronics cards. FIG. 1 shows a front-side perspective view that illustrates a prior-art card cage 100. As shown in FIG. 1, card cage 100 includes a metal structure 110 that has a series of edge support pairs ES1-ESn.

The members of each edge support pair ES1-ESn are substantially vertically in register with each other to support a corresponding number of electronics cards, such as electronics card EC. Insertion of electronics card EC into card cage 100 requires that card EC be placed between a pair of edge supports ES, such as edge support pair ESn, and then slid into cage 100 in the direction shown by arrow 112. (Although FIG. 1 shows the electronics card EC vertically held by card cage 100, electronics cards can also be held horizontally by a card cage.)

When multiple electronics cards are held by card cage 100, the electronics cards communicate with each other via another electronics card which is commonly known as a backplane. The backplane, which is connected to the back side of card cage 100, has a number of connectors that engage the connectors on the electronics cards when the electronics cards have been fully inserted into card cage 100.

Figure 2:
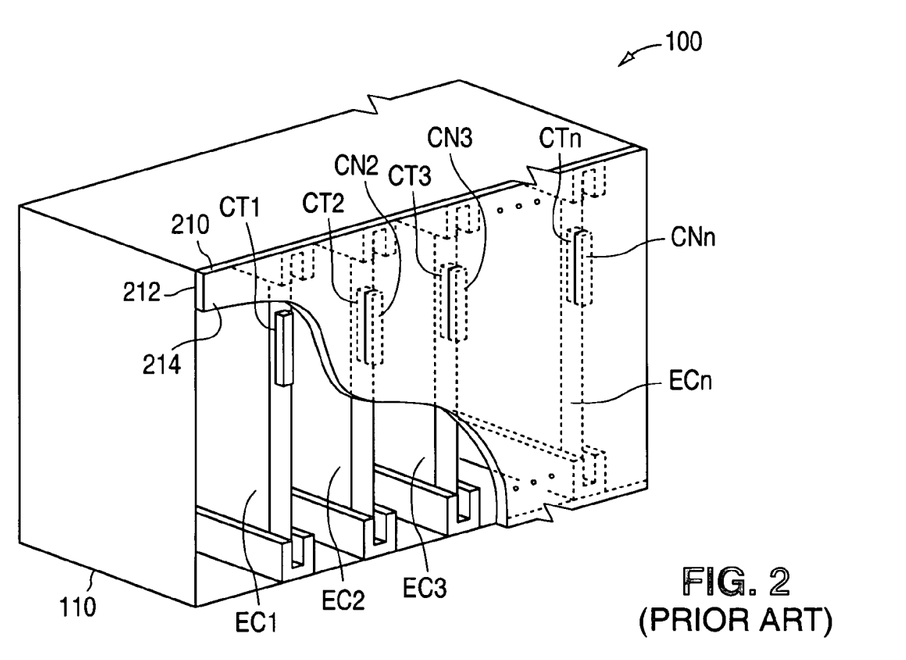
FIG. 2 is a back-side perspective view further illustrating prior-art card cage 100.

FIG. 2 shows a back-side perspective view that further illustrates prior-art card cage 100. As shown in FIG. 2, card cage 100 holds a series of electronics cards EC1-ECn that has a corresponding series of first connectors CT1-CTn. The first connectors CT1-CTn, which are shown as blocks in the figure, can be implemented with any electronics card connector.

In addition, an electronics card 210, such as a backplane, which is shown in a cut away view, is connected to the back side of card cage 100. Electronics card 210 has an inner surface 212, an outer surface 214, and a series of second connectors CN1-CNn (connector CN1 is not shown in the cut away view) formed on inner surface 212 that engage and form an electrical connection with the first connectors CT1-CTn when the electronics cards EC1-ECn have been fully inserted into card cage 100.

Although not shown in FIG. 2, electronics card 210 includes a number of internal electrical routing paths that are connected to each of the second connectors CN1-CNn. The internal electrical routing paths, in turn, form the physical portion of a number of card-to-card data busses and control lines.

To insure that a first connector CT and a second connector CN engage when an electronics card EC is slid into card cage 100, electronics card 210 must be precisely aligned to card cage 100 when electronics card 210 is attached to card cage 100. Without the precise alignment of electronics card 210, the first connectors CT and the second connectors CN are unable to mate when electronics card EC is inserted into card cage 100.

To aid in the alignment of electronics card 210 when electronics card 210 is attached to card cage 100, card cage 100 includes a number of alignment tabs that extend away from metal structure 110, while electronics card 210 includes a corresponding number of alignment openings that are formed through electronics card 210. When electronics card 210 is attached to card cage 100, the alignment tabs fit snugly in the alignment openings.

The alignment openings through electronics card 210 can be formed by first drilling a hole through electronics card 210 using a drill bit with a first diameter, such as 2.362 mm (0.093 inches). Following this, the hole is routed along a straight line using a routing bit that also has the first diameter to form an alignment opening with rounded ends.

Figure 3:
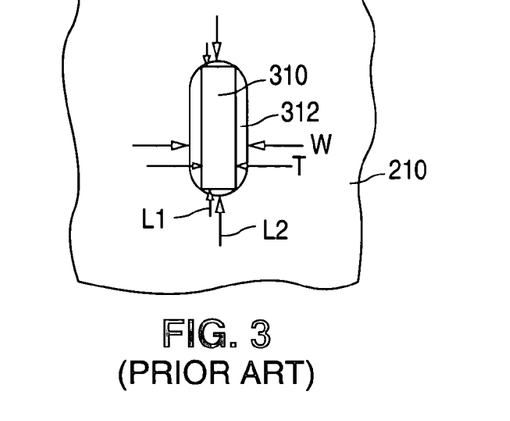
FIG. 3 is a partial end view additionally illustrating prior-art card cage 100.

FIG. 3 shows a partial end view of card cage 100 that additionally illustrates electronics card 210. As shown in FIG. 3, card cage 100 includes an alignment tab 310 that extends away from the back side of cage 100. Alignment tab 310, in turn, has a length L1 and a thickness T.

In addition, electronics card 210 has an alignment opening 312 formed through electronics card 210 that is precisely dimensioned in length to accept alignment tab 310 when electronics card 210 is attached to card cage 100. Alignment opening 312 is formed as described above using a drill and a router to have a maximum length L2 and a width W. Due to the curved ends of alignment opening 312, length L1 is less than maximum length L2.

However, as shown in FIG. 3, when the thickness of the metal used to form the alignment tabs is less than the diameters of the drill and router bits used to form alignment opening 312, only the four corners of alignment tab 310 can be brought into contact with the side walls of alignment opening 312 when alignment tab 310 is inserted into alignment opening 312.

When only four corners can be brought into contact with the supporting side walls, any rotational pressure placed on electronics card 210 from handling and assembly is concentrated at the four corners. Similarly, any longitudinal pressure (along the length of tab 310) placed on electronics card 210 from handling and assembly is concentrated at two of the corners.

When sufficient rotational or longitudinal pressure is exerted on electronics card 210, alignment opening 310 becomes deformed which, in turn, causes tab 310 to fit loosely within opening 312. When tab 310 fits loosely within alignment opening 312, a precise alignment can not be made.

As a result, a fixture or other device is commonly used to insure that electronics card 210 is precisely aligned to card cage 100 when electronics card 210 is attached to card cage 100. Although electronics cards can be attached to card cages using this fabrication approach, the fixtures can be costly to build, maintain, and utilize.

One approach to reducing deformation due to rotational pressure is to form the alignment openings with widths (which are defined by the diameter of the drill and router bits used to form the openings) that are substantially the same size as the thicknesses of the alignment tabs. As a result, the sides of the alignment tab contact the sides of the alignment opening.

Although this approach reduces deformation due to rotational pressure, potential deformation due to longitudinal pressure remains a problem. Another drawback to this approach is that the smaller drill and router bit sizes that must be used are non-standard which, in turn, significantly increases the fabrication costs of the electronics card. Drill and router bit sizes that are substantially less than, for example, 2.362 mm (0.093 inches), are not commonly used due to reliability and lifecycle concerns.

Thus, there is a need for a method of precisely aligning an electronics card, such as a backplane, to a structure, such as a card cage, when the electronics card is attached to the structure that eliminates the need for a fixture without using non-standard drill and router bit sizes.

SUMMARY OF THE INVENTION

An electronics card, such as a backplane, that can be precisely aligned with a structure, such as a card cage, is disclosed in accordance with a first embodiment of the present invention. The electronics card includes a surface, an electrical routing path that is connected to the surface, a plurality of spaced-apart electrical devices that are connected to the surface, and the electrical routing path, and an alignment opening that is formed in the surface of the electronics card.

The alignment opening has a first end section, a middle section, and a connecting section that connects the first end section to the middle section. The first end section has a first side wall that lies in a first plane and an opposing second side wall that lies in a second plane. The first side wall has a top end that contacts the surface and a bottom end that lies below and is spaced apart from the surface. The first and second planes are substantially parallel, spaced apart by a width, and roughly perpendicular to the surface.

The middle section has a first side wall that lies in a third plane and an opposing second side wall that lies in a fourth plane. The third and fourth planes are substantially parallel and spaced apart by the width. In addition, the third plane lies between the first and second planes.

An electronics device that includes an electronics card is disclosed in accordance with a second embodiment of the present invention. The electronics card has a surface, an electrical routing path that is connected to the surface, a plurality of spaced-apart electrical devices that are connected to the surface, and the electrical routing path, and an alignment opening that is formed in the surface of the electronics card.

The alignment opening has a first end section, a middle section, and a connecting section that connects the first end section to the middle section. The first end section has a first side wall that lies in a first plane, and an opposing second side wall that lies in a second plane. The first side wall has a top end that contacts the surface and a bottom end that lies below and is spaced apart from the surface. The first and second planes are substantially parallel, spaced apart by a width, and roughly perpendicular to the surface.

The middle section has a first side wall that lies in a third plane, and an opposing second side wall that lies in a fourth plane. The third and fourth planes are substantially parallel and spaced apart by the width. In addition, the third plane lies between the first and second planes.

The electronics device also includes a structure that has a protruding tab. The protruding tab has a thickness that is greater than zero and less than the width. Further, the protruding tab is inserted into the alignment opening.

An electronics device that includes an electronics card is disclosed in accordance with a third embodiment of the present invention. The electronics card has a front surface, a rear surface, a substantially uniform thickness between the front and rear surface, and an alignment opening that extends completely through the electronics card from the front surface to the rear surface. The alignment opening has a first end section, a middle section, and a connecting section. The first end section has a first side wall that extends from the front surface to the rear surface and lies in a first plane, and an opposing second side wall that extends from the front surface to the rear surface and lies in a second plane. The first and second planes are spaced apart by a substantially uniform width. The middle section has a first side wall that that extends from the front surface to the rear surface and lies in a third plane, and an opposing second side wall that that extends from the front surface to the rear surface and lies in a fourth plane. The third and fourth planes are spaced apart by a substantially uniform width. The third plane lies between the first and second planes. The connecting section connects the first end section to the middle section.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 4:
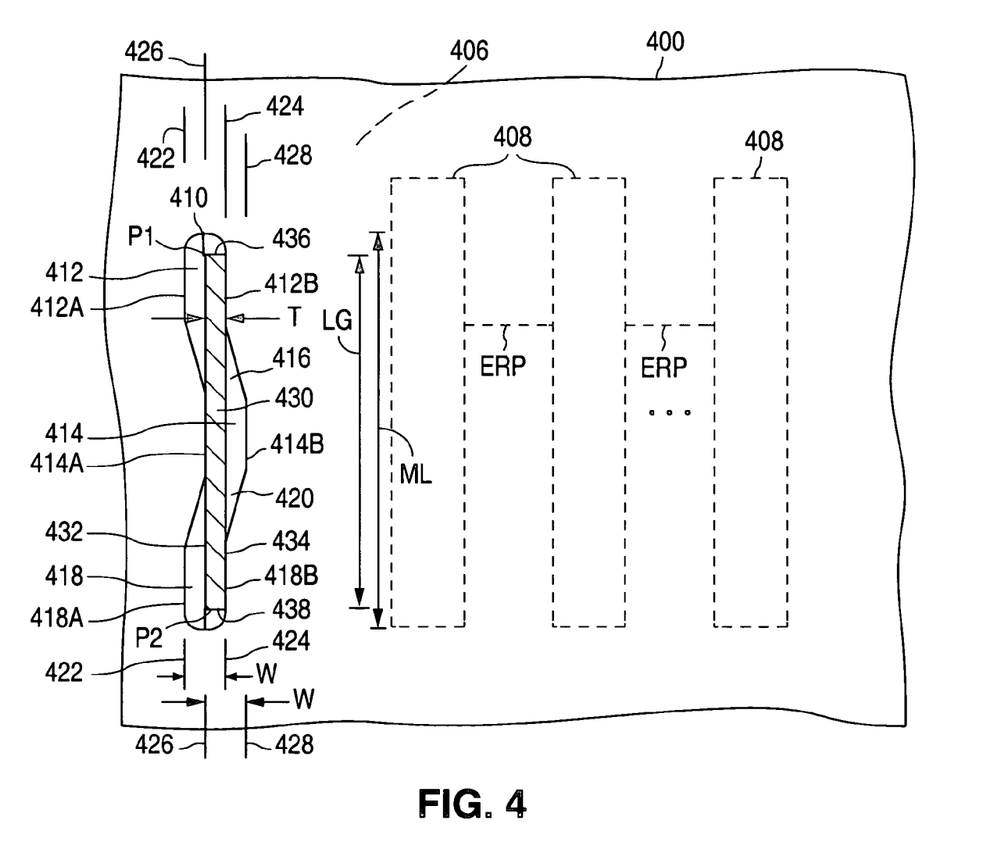
FIG. 4 is a plan view illustrating an example of an electronics card 400 in accordance with the present invention.

FIG. 4 shows a plan view that illustrates an example of an electronics card 400 in accordance with the present invention. As shown in FIG. 4, electronics card 400, which can be implemented as a backplane, includes a surface 406, a number of spaced-apart electrical devices 408, such as backplane connectors, that are connected to surface 406, and an alignment opening 410 formed through card 400 that has a maximum length ML.

As further shown in FIG. 4, electronics card 400 can also include a number of electrical routing paths ERP that are connected to each of the electrical devices 408. The electrical routing paths ERP can form, for example, the physical portion of a number of card-to-card data busses and control lines.

Alignment opening 410, in turn, has a first end section 412, a middle section 414, and a first connecting section 416 that connects first end section 412 to middle section 414. In addition, alignment opening 410 includes a second end section 418, and a second connecting section 420 that connects second end section 418 to middle section 414.

First end section 412 has a first side wall 412A and an opposing second side wall 412B, while second end section 418 has a first side wall 418A and an opposing second side wall 418B. In addition, first side wall 412A and first side wall 418A lie within a first plane 422, and second side wall 412B and second side wall 418B lie within a second plane 424. First plane 422 and second plane 424 are substantially parallel, have a width W, and are roughly perpendicular with surface 406.

Middle section 414, in turn, has a first side wall 414A that lies within a third plane 426, and a second side wall 414B that lies within a fourth plane 428. Third plane 426 and fourth plane 428, which have the width W, are substantially parallel, and are also substantially parallel with the first and second planes 422 and 424. Third plane 426 lies between, and is spaced part from, the first and second planes 422 and 424.

In accordance with the present invention, as further shown in FIG. 4, an alignment tab region 430, which has a thickness T that is less than width W, is defined by a first side wall 432 that lies in third plane 426, and an opposing second side wall 434 that lies in second plane 424.

By varying the location of first side wall 414A, which defines the location of third plane 426, with respect to the location of second side wall 412B, which defines the location of second plane 424, by varying the angle of first connecting section 416, the thickness T of alignment tab region 430 can be varied.

As a result, a tab alignment region 430 can be formed to snuggly accept an alignment tab that has a width of, for example, 1.5240 mm (0.060 inches) even though the alignment opening 410 was formed with drill and routing bits that have a much larger diameter, such as, 2.362 mm (0.093 inches).

In addition, alignment tab region 430 also has a length LG, which is less than maximum length ML, defined by a first end wall 436 that contacts and lies perpendicular to a first end of the first and second side walls 432 and 434, and a second end wall 438 that contacts and lies perpendicular to a second end of the first and second side walls 432 and 434.

As shown in FIG. 4, the outer end of first end section 412 is formed as a half circle with a center point P1 as a result of alignment opening 410 being first formed with a round drill bit. Similarly, the outer end of second end section 418 is formed as a half circle with a center point P2 as a result of alignment opening 410 being routed with a round routing bit.

As a result, when tab alignment region 430 has a uniform width, first end wall 436 can not extend beyond first center point P1 due to the curvature of the rounded end. Similarly, second end wall 438 can not extend beyond second center point P2 due to the curvature of the rounded end. Thus, the length LG of tab alignment region 430 is defined by the center-to-center dimension from center point P1 to center point P2. As a result, by varying the position of center points P1 and P2, the length LG of alignment tab region 430 can be varied.

Thus, although alignment opening 410 has a width W of, for example, 2.362 mm (0.093 inches) due to the diameter of the drill and routing bits, a rectangular tab alignment region 430 can be formed to accommodate alignment tabs within a thickness range that is greater than zero and less than the width W, and a length defined by the center to center dimension.

Alignment tab region 430 can represent an opening when card 400 is not connected to a structure, such as a card cage, and no alignment tab is present. Alternately, region 430 can represent the alignment tab of a structure, such as a card cage, when card 400 is connected to the structure and the alignment tab is inserted into opening 410.

Figure 5:
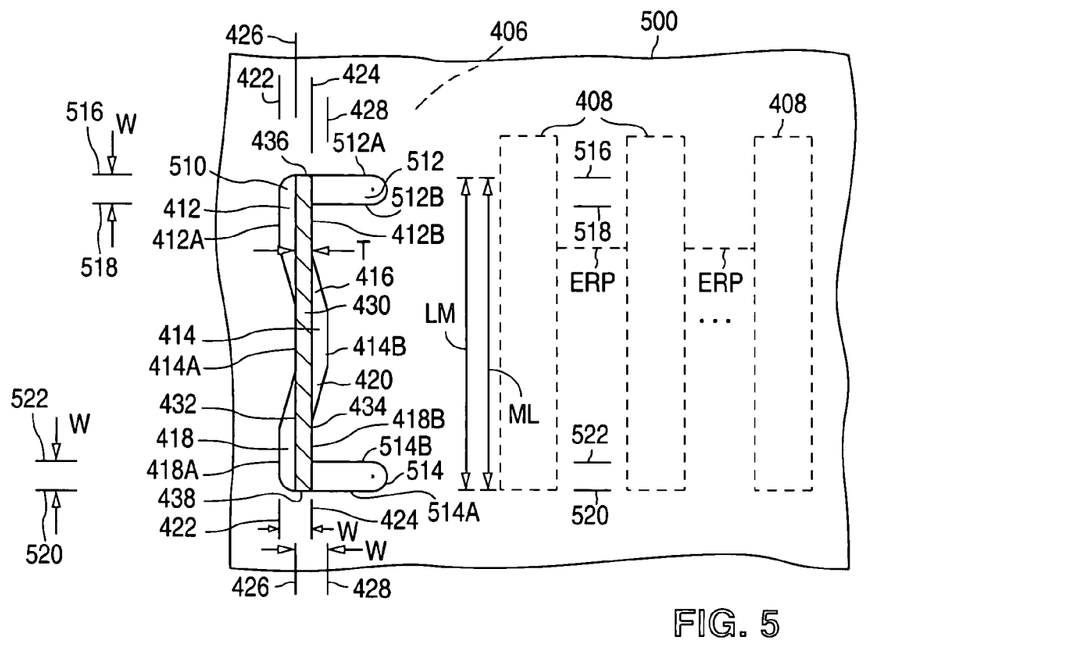
FIG. 5 is a plan view illustrating an example of an electronics card 500 in accordance with a first alternate embodiment of the present invention.

FIG. 5 shows a plan view that illustrates an example of an electronics card 500 in accordance with a first alternate embodiment of the present invention. Card 500 is similar to card 400 and, as a result, utilizes the same reference numerals to designate the structures which are common to both cards.

As shown in FIG. 5, card 500 differs from card 400 in that card 500 has an alignment opening 510. Alignment opening 510 is the same as alignment opening 410 except that alignment opening 510 also includes a first cap section 512 that contacts and extends away from first end section 412, and a second cap section 514 that contacts and extends away from second end section 418.

First cap section 512 has a first side wall 512A that lies in a fifth plane 516 and an opposing second side wall 512B that lies in a sixth plane 518, while second cap section 514 has a first side wall 514A that lies in a seventh plane 520, and an opposing second side wall 514B that lies in an eighth plane 522.

In addition, fifth plane 516 and sixth plane 518 are substantially parallel, have the width W, and lie roughly perpendicular to first, second, third, and fourth planes 422, 424, 426, and 428. Further, seventh plane 520 and eighth plane 522 are substantially parallel, have the width W, and lie roughly perpendicular to first, second, third, and fourth planes 422, 424, 426, and 428.

As shown in FIG. 5, when the thickness T of alignment tab region 430 is equal to or less than one-half the width W, first cap section 512 forms first side wall 512A to have a flat surface that adjoins first end wall 436 of alignment tab region 430, and second cap section 514 forms first side wall 514A to have a flat surface that adjoins second end wall 438 of alignment tab region 430.

As a result, as further shown in FIG. 5, when the thickness T of alignment tab region 430 is greater than zero and equal to or less than one-half the width W, first and second end caps 512 and 514 allow alignment opening 510 to have a length LM that is exactly the same as the maximum length ML of alignment opening 510.

Alignment tab region 430 can represent an opening when card 500 is not connected to a structure, such as a card cage, and no alignment tab is present. Alternately, region 430 can represent the alignment tab of a structure, such as a card cage, when card 500 is connected to the structure and the alignment tab is inserted into opening 510.

Figure 6:
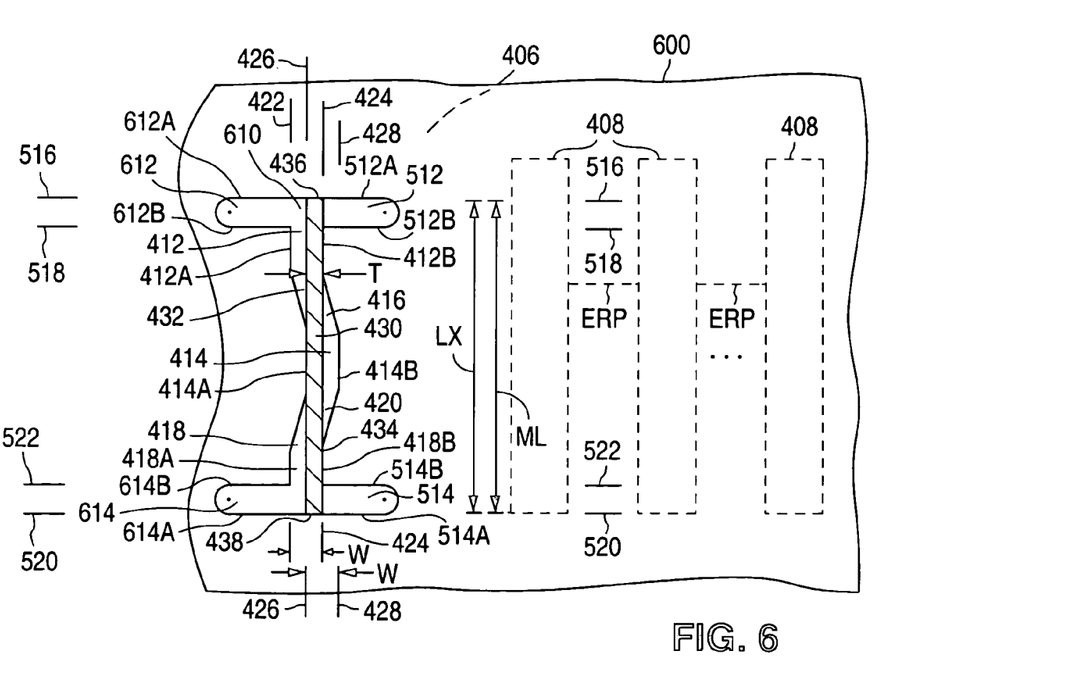
FIG. 6 is a plan view illustrating an example of an electronics card 600 in accordance with a second alternate embodiment of the present invention.

FIG. 6 shows a plan view that illustrates an example of an electronics card 600 in accordance with a second alternate embodiment of the present invention. Card 600 is similar to card 500 and, as a result, utilizes the same reference numerals to designate the structures which are common to both cards.

As shown in FIG. 6, card 600 differs from card 500 in that card 600 has an alignment opening 610. Alignment opening 610 is the same as alignment opening 510 except that alignment opening 610 also includes a third cap section 612 that contacts and extends away from first end section 412, and a fourth cap section 614 that contacts and extends away from second end section 418.

Third cap section 612 has a first side wall 612A that lies in fifth plane 516, and an opposing second side wall 612B that lies in sixth plane 518, while fourth cap section 614 has a first side wall 614A that lies in seventh plane 520, and an opposing second side wall 614B that lies in eighth plane 522.

As shown in FIG. 6, when the thickness T of alignment tab region 430 is greater than zero and less than the width W, first and third cap sections 512 and 612 form first side walls 512A and 612A to have a flat surface that adjoins first end wall 436 of alignment tab region 430. In addition, second and fourth cap sections 514 and 614 form first side walls 514A and 614A to have a flat surface that adjoins second end wall 438 of alignment tab region 430.

As a result, as further shown in FIG. 6, when the thickness T of alignment tab region 430 is greater than zero and less than the width W, first, second, third, and fourth end caps 512, 514, 612, and 614 allow alignment opening 610 to have a length LX that is exactly the same as the maximum length ML of alignment opening 610.

Alignment tab region 430 can represent an opening when card 600 is not connected to a structure, such as a card cage, and no alignment tab is present. Alternately, region 430 can represent the alignment tab of a structure, such as a card cage, when card 600 is connected to the structure and the alignment tab is inserted into opening 610.

Figure 7:
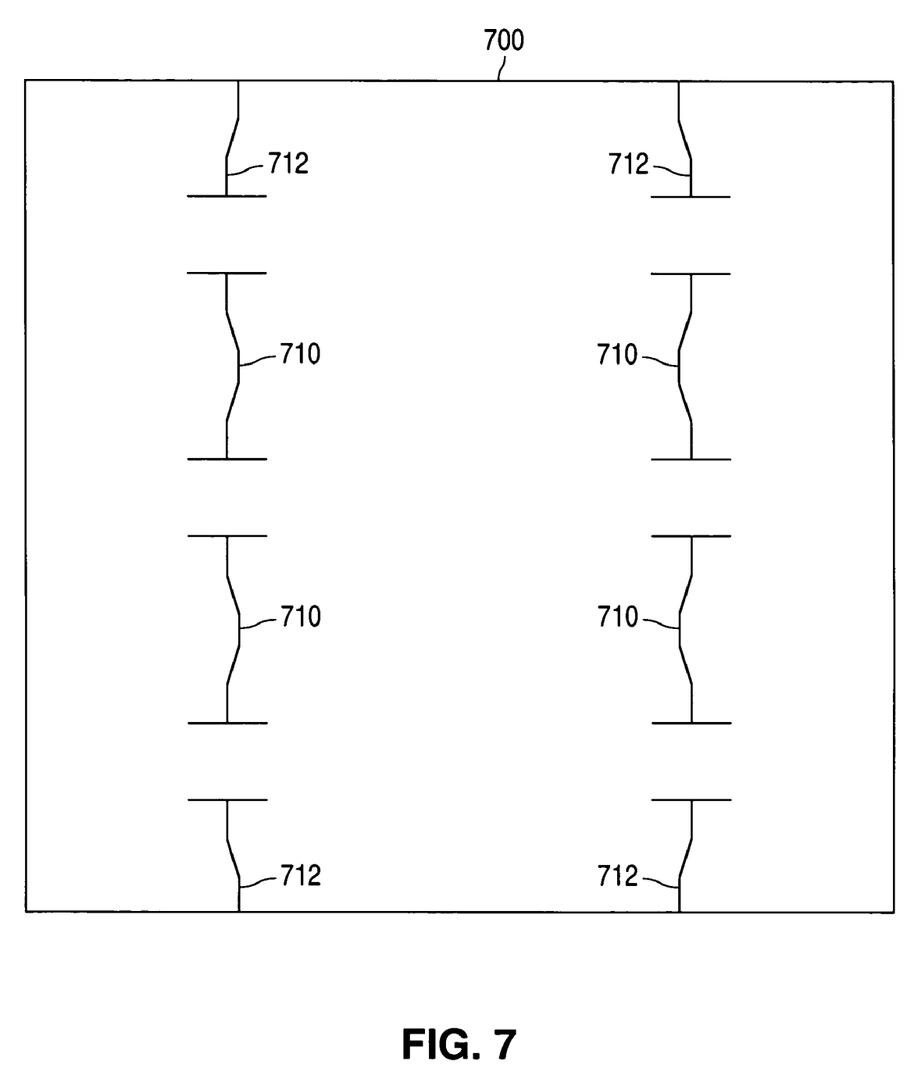
FIG. 7 is a plan view illustrating an example of an electronics card 700 in accordance with the present invention.

FIG. 7 shows a plan view that illustrates an example of an electronics card 700 in accordance with the present invention. As shown in FIG. 7, card 700 includes a number of first alignment openings 710, and a number of second alignment openings 712. The first alignment openings 710 are the same as first alignment opening 610.

The second alignment openings 712 are located at the edges of electronics card 700, and are one-half in length of first alignment opening 610, e.g., first end section 412, one-half of middle section 414, connecting section 416, and first cap sections 512 and 612, or one-half of middle section 414, second end section 418, connecting section 420, and second cap sections 514 and 614.

When a number of tabs, which protrude from a structure, such as a card cage, are inserted into the first and second alignment openings 710 and 712, the side walls of the tabs contact the side walls of the first and second alignment openings 710 and 712 even though the thicknesses of the tabs are less than the widths of the first and second alignment openings 710 and 712. In addition, the tabs fit flat up against the end walls even though the openings are formed with a round bit.

As a result, the present invention allows an electronics card, such as card 700, to be precisely positioned when attached to a structure, such as card cage 100, via tabs that protrude from the structure. Once the electronics card has been attached to the structure via the tabs, the electronics card can be rigidly connected to the structure via a fastening system such as, screws, bolts, and nuts.

One of the advantages of the present invention is that the present invention significantly increases the rotational and longitudinal pressure that is required to deform the alignment opening. As a result, an electronics card in accordance with the present invention requires minimal assembly time to precisely-align and connect an electronics card, such as a backplane, to a structure, such as a card cage, and does not require any special alignment fixture or non-standard drill and routing bit sizes.

It should be understood that the above descriptions are examples of the present invention, and that various alternatives of the invention described herein may be employed in practicing the invention. For example, although FIGS. 4, 5, and 6 show alignment openings 410, 510, and 610, respectively, lying substantially parallel to devices 408, alignment openings 410, 510, and 610 can have any orientation with respect to devices 408.

As a result, alignment openings 410, 510, and 610 can work with a structure, such as a card cage, that has horizontal tabs, vertical tabs, or tabs of any orientation. Thus, it is intended that the following claims define the scope of the invention and that structures and methods within the scope of these claims and their equivalents be covered thereby.

What is claimed is:

1. An electronics card comprising:
a surface;
an electrical routing path connected to the surface;
a plurality of spaced-apart electrical devices connected to the surface and the electrical routing path; and
an alignment opening formed in the surface of the electronics card, the alignment opening having:
a first end section having a first side wall that lies in a first plane and an opposing second side wall that lies in a second plane, the first side wall having a top end that contacts the surface and a bottom end that lies below and is spaced apart from the surface, the first and second planes being substantially parallel, spaced apart by a width, and roughly perpendicular to the surface;
a middle section having a first side wall that lies in a third plane and an opposing second side wall that lies in a fourth plane, the third and fourth planes being substantially parallel and spaced apart by the width, the third plane lying between the first and second planes; and
a connecting section that connects the first end section to the middle section.

2. An electronics card comprising:
a surface;
an electrical routing path connected to the surface;
a plurality of spaced-apart electrical devices connected to the surface and the electrical routing path; and
an alignment opening formed in the surface of the electronics card, the alignment opening having:
a first end section having a first side wall that lies in a first plane and an opposing second side wall that lies in a second plane, the first side wall having a top end that contacts the surface and a bottom end that lies below and is spaced apart from the surface, the first and second planes being substantially parallel, spaced apart by a width, and roughly perpendicular to the surface;
a middle section having a first side wall that lies in a third plane and an opposing second side wall that lies in a fourth plane, the third and fourth planes being substantially parallel and spaced apart by the width, the third plane lying between the first and second planes;
a connecting section that connects the first end section to the middle section; and
a first cap section that contacts the first end section, the first cap section having a first side wall that lies in a fifth plane and an opposing second side wall that lies in a sixth plane, the fifth and sixth planes being substantially parallel, spaced apart by the width, and roughly perpendicular to the first, second, third, and fourth planes.

3. The electronics card of claim 2 wherein the alignment opening further includes a second cap section that contacts the first end section and extends away from the first cap section, the second cap section having a first side wall that lies in the fifth plane and an opposing second side wall that lies in the sixth plane.

4. The electronics card of claim 2 wherein the alignment opening further includes:
a second end section having a first side wall that lies in the first plane and an opposing second side wall that lies in the second plane; and
a connecting section that connects the second end section to the middle section.

5. The electronics card of claim 4 wherein the alignment opening further includes,
a second cap section that contacts the second end section, the second cap section having a first side wall that lies in a seventh plane and an opposing second side wall that lies in an eighth plane, the seventh and eighth planes being substantially parallel, spaced apart by the width, and roughly perpendicular to the first, second, third, and fourth planes.

6. The electronics card of claim 5 wherein the alignment opening further includes:
   a third cap section that contacts the first end section and extends away from the first cap section, the third cap section having a first side wall that lies in the fifth plane and an opposing second side wall that lies in the sixth plane; and
   a fourth cap section that contacts the second end section and extends away from the second cap section, the fourth cap section having a first side wall that lies in the seventh plane and an opposing second side wall that lies in the eighth plane.

7. An electronics device comprising:
   an electronics card having:
   a surface;
   an electrical routing path connected to the surface;
   a plurality of spaced-apart electrical devices connected to the surface and the electrical routing path; and
   an alignment opening formed in the surface of the electronics card, the alignment opening having:
   a first end section having a first side wall that lies in a first plane and an opposing second side wall that lies in a second plane, the first side wall having a top end that contacts the surface and a bottom end that lies below and is spaced apart from the surface, the first and second planes being substantially parallel, spaced apart by a width, and roughly perpendicular to the surface;
   a middle section having a first side wall that lies in a third plane and an opposing second side wall that lies in a fourth plane, the third and fourth planes being substantially parallel and spaced apart by the width, the third plane lying between the first and second planes; and
   a connecting section that connects the first end section to the middle section; and
   a structure having a protruding tab, the protruding tab having a thickness that is greater than zero and less than the width, and being inserted into the alignment opening.

8. The electronics device of claim 7 wherein the protruding tab contacts the second side wall of the first end section, and the first side wall of the middle section.

9. The electronics device of claim 8 wherein the protruding tab is spaced apart from the first side wall of the first end section, and the second side wall of the middle section.

10. The electronics device of claim 7 wherein the alignment opening further includes:
    a second end section having a first side wall that lies in the first plane and an opposing second side wall that lies in the second plane; and
    a connecting section that connects the second end section to the middle section.

11. The electronics device of claim 10 wherein the protruding tab contacts the second side walls of the first and second end sections, and the first side wall of the middle section.

12. The electronics device of claim 11 wherein the protruding tab is spaced apart from the first side walls of the first and second end sections, and the second side wall of the middle section.

13. An electronics device comprising:
    an electronics card having:
    a surface;
    an electrical routing path connected to the surface;
    a plurality of spaced-apart electrical devices connected to the surface and the electrical routing path; and
    an alignment opening formed in the surface of the electronics card, the alignment opening having:
    a first end section having a first side wail that lies in a first plane and an opposing second side wall that lies in a second plane, the first side wall having a top end that contacts the surface and a bottom end that lies below and is spaced apart from the surface, the first and second planes being substantially parallel, spaced apart by a width, and roughly perpendicular to the surface;
    a middle section having a first side wall that lies in a third plane and an opposing second side wall that lies in a fourth plane, the third and fourth planes being substantially parallel and spaced apart by the width, the third plane lying between the first and second planes;
    a connecting section that connects the first end section to the middle section; and
    a first cap section that contacts the first end section, the first cap section having a first side wail that lies in a fifth plane and an opposing second side wail that lies in a sixth plane, the fifth and sixth planes being substantially parallel, spaced apart by the width, and roughly perpendicular to the first, second, third, and fourth planes; and
    a structure having a protruding tab, the protruding tab having a thickness that is greater than zero and less than the width, and being inserted into the alignment opening, the protruding tab contacting the second side wail of the first end section, and the first side wall of the middle section, and being spaced apart from the first side wall of the first end section, and the second side wall of the middle section.

14. The electronics device of claim 13 wherein the alignment opening further includes a second cap section that contacts the first end section and extends away from the first cap section, the second cap section having a first side wall that lies in the fifth plane and an opposing second side wall that lies in the sixth plane.

15. The electronics device of claim 13 wherein the alignment opening further includes:
    a second end section having a first side wall that lies in the first plane and an opposing second side wall that lies in the second plane;
    a connecting section that connects the second end section to the middle section; and
    a second cap section that contacts the second end section, the second cap section having a first side wall that lies in a seventh plane and an opposing second side wall that lies in an eighth plane, the seventh and eighth planes being substantially parallel, spaced apart by the width, and roughly perpendicular to the first, second, third, and fourth planes.

16. The electronics card of claim 15 wherein the alignment opening further includes:
    a third cap section that contacts the first end section and extends away from the first cap section, the third cap section having a first side wall that lies in the fifth plane and an opposing second side wall that lies in the sixth plane; and
    a fourth cap section that contacts the second end section and extends away from the second cap section, the fourth cap section having a first side wall that lies in the seventh plane and an opposing second side wall that lies in the eighth plane.

17. An electronics device comprising:
an electronics card having a front surface, a rear surface, a substantially uniform thickness between the front and rear surfaces, and an alignment opening that extends completely through the electronics card from the front surface to the rear surface, the alignment opening having:
  a first end section having a first side wall that extends from the front surface to the rear surface and lies in a first plane, and an opposing second side wall that extends from the front surface to the rear surface and lies in a second plane, the first and second planes being spaced apart by a substantially uniform width;
  a middle section having a first side wall that that extends from the front surface to the rear surface and lies in a third plane, and an opposing second side wall that that extends from the front surface to the rear surface and lies in a fourth plane, the third and fourth planes being spaced apart by a substantially uniform width, the third plane lying between the first and second planes; and
  a connecting section that connects the first end section to the middle section.

18. The electronics device of claim 17 wherein a length of a side of the electronics card is substantially greater than the thickness of the electronics card.

19. The electronics device of claim 17 and further comprising a structure having a protruding tab, the protruding tab having a thickness that is greater than zero and less than the width between the first and second planes, and being inserted into the alignment opening.

20. The electronics device of claim 19 wherein the protruding tab contacts the second side wall of the first end section, and the first side wall of the middle section.

21. The electronics device of claim 20 wherein the protruding tab is spaced apart from the first side wall of the first end section, and the second side wall of the middle section.

22. An electronics device comprising:
an electronics card having a surface, and an alignment opening formed in the surface of the electronics card, the alignment opening having:
  a first section having a first side wall that lies in a first plane and an opposing second side wall that lies in a second plane, the first side wall having a top end that contacts the surface and a bottom end that lies below and is spaced apart from the surface, the first and second planes being substantially parallel, spaced apart by a width, and roughly perpendicular to the surface;
  a second section having a first side wall that lies in a third plane and an opposing second side wall that lies in a fourth plane, the third and fourth planes being substantially parallel and spaced apart by the width, the third plane lying between the first and second planes;
  a third section that connects the first section to the second section; and
  a fourth section that contacts the first section, the fourth section having a first side wall that lies in a fifth plane and an opposing second side wall that lies in a sixth plane, the fifth and sixth planes being substantially parallel, spaced apart by the width, and roughly perpendicular to the first, second, third, and fourth planes.

23. The electronics card of claim 22 wherein the alignment opening further includes a fifth section that contacts the first section and extends away from the fourth section, the fifth section having a first side wall that lies in the fifth plane and an opposing second side wall that lies in the sixth plane.

24. The electronics card of claim 22 wherein the alignment opening further includes:
  a fifth section having a first side wall that lies in the first plane and an opposing second side wall that lies in the second plane; and
  a sixth section that connects the second section to the fifth section.

25. The electronics card of claim 24 wherein the alignment opening further includes a seventh section that contacts the fifth section, the seventh section having a first side wall that lies in a seventh plane and an opposing second side wall that lies in an eighth plane, the seventh and eighth planes being substantially parallel, spaced apart by the width, and substantially perpendicular to the first, second, third, and fourth planes.

* * * * *

UNITED STATES PATENT AND TRADEMARK OFFICE
CERTIFICATE OF CORRECTION

PATENT NO. : 7,170,755 B2 Page 1 of 1
APPLICATION NO. : 10/732617
DATED : January 30, 2007
INVENTOR(S) : Keller It is certified that error appears in the above-identified patent and that said Letters Patent is hereby corrected as shown below:

Column 3,

Line 11, delete "sufface" and replace with --surface--.

Line 60, delete "surface," and replace with --surfaces,--.

Column 10,

Lines 6, 23, 24 and 33, delete "wail" and replace with --wall--.

Signed and Sealed this

Third Day of April, 2007

JON W. DUDAS
*Director of the United States Patent and Trademark Office*